United States Patent

Bosselmann et al.

[11] Patent Number: 6,034,523
[45] Date of Patent: Mar. 7, 2000

[54] METHOD AND ARRANGEMENT FOR MEASURING A MAGNETIC FIELD USING THE FARADAY EFFECT, WITH COMPENSATION FOR INTENSITY CHANGES

[75] Inventors: Thomas Bosselmann; Peter Menke, both of Erlangen, Germany

[73] Assignee: Siemens Aktiengesellschaft, Munich, Germany

[21] Appl. No.: 08/894,577

[22] PCT Filed: Feb. 9, 1996

[86] PCT No.: PCT/DE96/00208

§ 371 Date: Aug. 22, 1997

§ 102(e) Date: Aug. 22, 1997

[87] PCT Pub. No.: WO96/26452

PCT Pub. Date: Aug. 29, 1996

[30] Foreign Application Priority Data

Feb. 22, 1995 [DE] Germany .......................... 195 06 169

[51] Int. Cl.[7] .......................... G01R 33/00; G01R 31/00; G01R 33/02
[52] U.S. Cl. ..................... 324/117 R; 324/96; 324/244.1
[58] Field of Search .................. 324/117 R, 96, 324/244.1

[56] References Cited

U.S. PATENT DOCUMENTS

| | | | |
|---|---|---|---|
| 4,370,612 | 1/1983 | Puech et al. | 324/117 R |
| 4,539,519 | 9/1985 | Ulrich et al. | 324/117 R |
| 4,542,338 | 9/1985 | Arditty et al. | 324/117 R |
| 4,563,639 | 1/1986 | Langeac | 324/96 |
| 4,563,646 | 1/1986 | Desormiere | 324/244 |
| 4,916,387 | 4/1990 | Miller . | |
| 5,434,501 | 7/1995 | Esman et al. . | |
| 5,475,298 | 12/1995 | Rogers | 324/117 R |

FOREIGN PATENT DOCUMENTS

| | | |
|---|---|---|
| 60-138480 | 7/1985 | Japan . |
| WO 92/13280 | 8/1992 | WIPO . |

OTHER PUBLICATIONS

M.J. Marrone et al., "Fiber–Optic Magnetic Field Sensor With An Orthoconjugating Loop Mirror", Optics Letters, No. 18, pp. 1556–1558 (Sep. 15, 1993).

Xiaojun Fang et al., "A Reciprocal–Compensated Fiber–Optic Electric Current Sensor", Journal of Lightwave Technology, vol. 12, No. 10 (Oct. 1994).

H. Sohlstrom et al. "Transmission Loss Compensation for Faraday Effect Fibre Optic Sensors" Conference Eurosensors VIII, (Sep. 28, 1994).

*Primary Examiner*—Josie Ballato
*Assistant Examiner*—Jermele M. Hollington
*Attorney, Agent, or Firm*—Kenyon & Kenyon

[57] ABSTRACT

Two light signals pass, in opposite directions, through a series circuit comprising a first optical fiber, a first polarizer, a Faraday sensor device, a second polarizer and a second optical fiber. To set the working point, additionally, the planes of polarization of both light signals are reciprocally rotated by a predetermined angle of rotation by rotation means between the two polarizers. From light intensities of the two light signals, after passing through the series circuit, a measuring signal is determined which is independent of vibrations and bending influences in the optical fibers.

47 Claims, 3 Drawing Sheets

METHOD AND ARRANGEMENT FOR MEASURING A MAGNETIC FIELD USING THE FARADAY EFFECT, WITH COMPENSATION FOR INTENSITY CHANGES

BACKGROUND INFORMATION

The present invention is directed to a method and an arrangement for measuring a magnetic field.

Optical measuring arrangements and measuring methods for measuring a magnetic field, using the magneto-optic Faraday effect, are known. The Faraday effect is the term used to describe the phenomenon in which a plane of polarization of linearly polarized light is rotated as a function of a magnetic field. The angle of rotation is proportional to the path integral over the magnetic field along the path traced by the light, with the "Verdet constant" as a constant of proportionality. The Verdet constant is generally dependent on several factors, including the material, the temperature, and the wavelength. To measure the magnetic field, a Faraday sensor device made of an optically transparent material such as, for example, glass, is arranged in the magnetic field. The magnetic field effects a rotation of the plane of polarization of linearly polarized light transmitted through the Faraday sensor device. The angle of rotation can be evaluated using a measuring signal.

Such magneto-optic measuring methods and measuring arrangements find application, as is known, in the measurement of electric currents. The Faraday sensor device is arranged for this purpose in the vicinity of a current conductor and detects the magnetic field produced by a current in the current conductor. In general, the Faraday sensor device surrounds the current conductor, so that the measuring light orbits around the current conductor in a closed path. The magnitude of the angle of rotation in this case is, to a good approximation, directly proportional to the amplitude of the current to be measured. The Faraday sensor device can be designed as a solid glass ring around the current conductor, or, alternatively, the sensor device can surround the current conductor in the form of a measurement winding made of a light-guiding fiber (fiber coil) having at least one turn.

Advantages of these magneto-optic measuring arrangements and measuring methods over conventional inductive current converters are the potential isolation and the insensitivity with respect to electromagnetic disturbances. However, magneto-optic current converters are vulnerable to mechanical vibrations, which can affect the sensor device and the optical feed lines and consequently lead to intensity changes that render the measurement as inaccurate. The sensor device is also vulnerable to temperature changes.

In order to reduce the influence of vibrations on the measurement, previously proposed systems have transmitted two oppositely directed light signals, that is to say, light signals propagating in opposite directions, through a Faraday sensor device. This measure is based on the idea that the linear birefringence experienced by the two light signals on their common light path as a result of vibrations can be differentiated as a reciprocal effect from the nonreciprocal Faraday effect by means of suitable signal processing.

In one of these previously proposed systems, two linearly polarized light signals, running in opposite directions, are transmitted through an optical fiber coil as a Faraday sensor device which surrounds a current conductor. Provided as optical fiber for the fiber coil is a mechanically twisted fiber or a fiber twisted during the drawing process and having a high linear birefringence (spun HiBi fiber). Apart from the Faraday effect, the optical fiber also exhibits a circular birefringence which is high in comparison with the Faraday effect. After passing through the sensor device, each of the two light signals is decomposed by a polarizing beam splitter into two components which are polarized transversely to each other. Using the total of four light components, a measuring signal is derived by a signal processing means for an electric current in the current conductor. The signal essentially corresponds to the quotient of the Faraday measuring angle and the circular birefringence of the fiber and is therefore independent of a linear birefringence in the optical fiber. Although the measuring signal thus obtained is largely free of temperature-induced linear birefringence in the sensor device, the measuring signal is still temperature-dependent because of the temperature dependence of the circular birefringence of the fiber. In this system, the two light signals, running in opposite directions, pass through only the Faraday sensor device on a common light path and, upon emerging from the Faraday sensor device, are again separated from each other by optical couplers. This system is described in PCT publication WO 92/13280.

Other previously proposed systems use two light signals that pass, in mutually opposite directions of circulation, through an optical series circuit consisting of a first optical fiber, a first polarizer, a Faraday sensor device, a second polarizer, and a second optical fiber. Both light signals, after passing through the optical series circuit, are converted in each case by corresponding photoelectric transducers into one electric intensity signal.

In U.S. Pat. No. 4,916,387, a solid glass ring which surrounds the current conductor is provided as a Faraday sensor device. The axes of polarization of the two polarizers are rotated at an angle of 45° relative to each other. To compensate for undesired intensity changes in the optical feed fibers, it is assumed that the undesired intensity changes (noise) and the intensity changes caused by the Faraday effect are cumulatively superimposed with different signs in the two electric intensity signals, and can therefore be separated from each other.

In a previously proposed system discussed in the Journal of Lightwave Technology, Vol 12. No. 10, October 1994, pages 1882 to 1890, a fiber coil made of a single-mode fiber with a low birefringence is provided as the Faraday sensor device. The axes of polarization of the two polarizers mutually form a polarizer angle that is different from 0°, which is preferably 45°. Light from a single light source is split into the two light signals, and these light signals are each coupled via an optical coupler into the associated optical fiber. From the two electric intensity signals which correspond to the light intensities of the associated light signals after passing through the series circuit, a measuring signal is derived which corresponds to the quotient of the difference and the sum of the two intensity signals. Hence, the attenuation factors of the two optical fibers can essentially be compensated. Nevertheless, the light intensities of the two light signals must be adjusted to be exactly equal when coupling into the series circuit.

In another previously proposed system, which is discussed in "Transmission loss compensation for Faraday effect fiber optic sensors", Conference Eurosensors VIII, Toulouse, Sep. 25–28, 1994, an optical series circuit, which consists of multimode fibers as optical fibers, polarizers and Faraday sensor device is connected between two infrared light-emitting diodes. The two light-emitting diodes are operated alternately as light source and as photodetector.

Thus, only one of the two oppositely directed light signals is ever passing through the series circuit at one point of time. Therefore, the changeover clock frequency is selected to be as high as possible.

SUMMARY OF THE INVENTION

An object of the present invention is to specify a measuring method and a measuring arrangement for measuring a magnetic field and, in particular, for measuring an electric current using the Faraday effect, in which intensity changes in the optical transmission paths for two light signals, running in opposite directions, are virtually completely eliminated.

In order to achieve this object, the present invention passes two light signals, in mutually opposite feed directions, through an optical series circuit, which comprises a first optical transmission path, a first polarizer, a Faraday sensor device, a second polarizer, and a second optical transmission path. Between the two polarizers, the plane of polarization of each of the two light signals is rotated by a predetermined angle of rotation $\alpha$ which is independent of the magnetic field. By the selection of this angle of rotation $\alpha$, the working point of the measuring method or of the measuring arrangement can be set, given a zero magnetic field. In order to rotate the planes of polarization of both light signals by the predetermined angle of rotation $\alpha$, rotation means are optically connected between the two polarizers. Using the light intensities of the two light signals, in each case after their passage through the optical series circuit, a measuring signal which is essentially independent of intensity changes in the two transmission paths is derived for the magnetic field. Appropriate evaluation means are provided to derive the measuring signal.

In a first advantageous specific embodiment, the predetermined angle of rotation $\alpha$ is set to an odd-numbered multiple of about ±45° or ±π/4. Hence, the working point of the measuring method and of the measuring arrangement is so set that the measuring sensitivity is maximum.

The rotation means can be formed by one or a plurality of rotation elements which, in each case, exhibit a reciprocal circular birefringence. Such a reciprocal rotation of the planes of polarization of the two light signals can be achieved with the aid of optically active materials, or else with the aid of a geometrically induced circular birefringence. In one special embodiment, the Faraday sensor device itself forms at least part of the rotation means and, apart from the Faraday effect, also exhibits a reciprocal circular birefringence for this purpose.

The axes of polarization of the two polarizers are preferably set at least approximately parallel to each other, or at least approximately orthogonal to each other.

The two optical transmission paths for the light signals can be formed by multimode optical fibers.

Preferably, a quotient of two linear functions of the light intensities of the two light signals is determined as the measuring signal. The coefficients of these linear functions can be adapted to different input intensities of the two light signals when coupling into the series circuit. Especially in the case of identical input intensities of both the light signals, the measuring signal can be selected to be proportional to the quotient of a difference and the sum of both light intensities. In addition, a measuring signal which is proportional to a quotient of the two light intensities of the two light signals can also be used.

If the Faraday sensor device exhibits a linear birefringence, temperature changes can lead to measurement errors. In one advantageous embodiment, to compensate for these temperature influences, the axes of polarization of the two polarizers are rotated by a predetermined polarizer angle $\gamma$ in relation to an intrinsic axis of the linear birefringence in the sensor device. This polarizer angle $\gamma$ is determined at least approximately by $\cos(4\gamma-2\alpha)=-2/3$.

DETAILED DESCRIPTION

Figure 1:
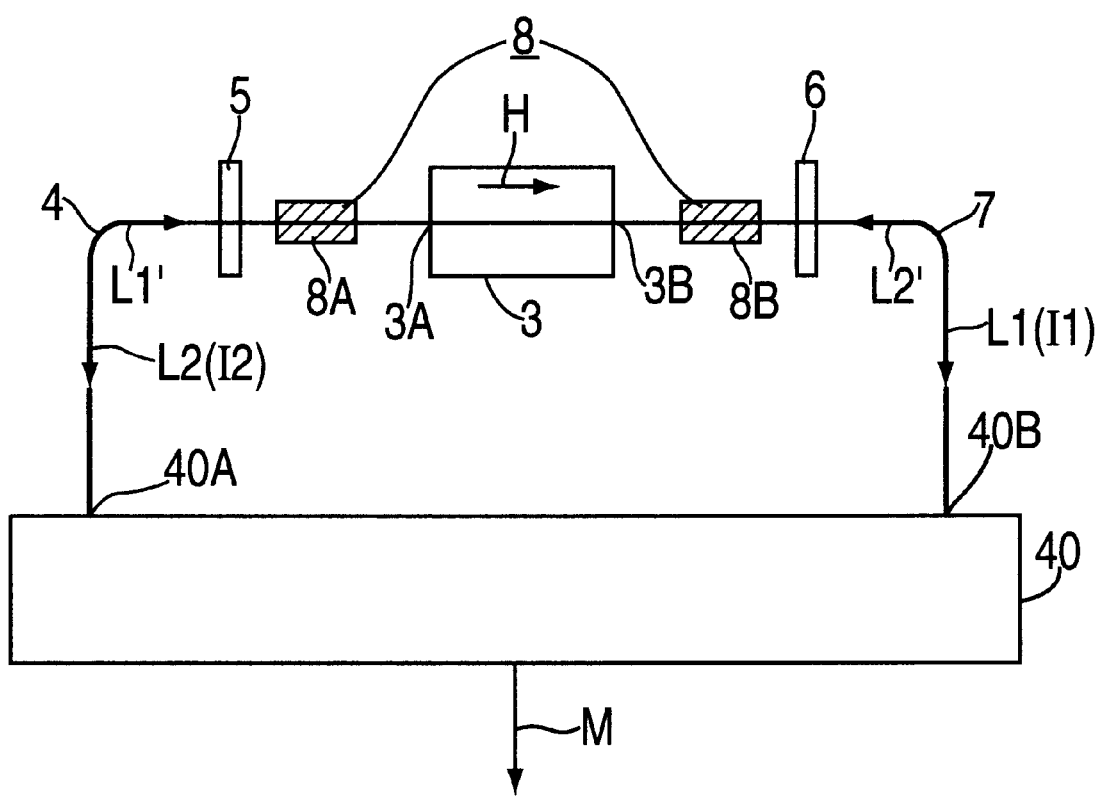
FIG. 1 shows a measuring arrangement for measuring a magnetic field with a Faraday sensor device and rotation means, in accordance with the present invention.

In FIG. 1, a Faraday sensor device is designated by 3, two optical transmission paths by 4 and 7, two polarizers by 5 and 6, optical rotation means by 8 and a transmitting and evaluation unit by 40.

Faraday sensor device 3 comprises at least one material capable of exhibiting the magneto-optic Faraday effect. Under the influence of a magnetic field H that at least partially penetrates sensor device 3, the polarization of polarized light running through sensor device 3 is changed because of the Faraday effect. Sensor device 3 can be designed in a manner known per se with one or a plurality of solid bodies, preferably made of glass, or else with at least one optical fiber. Sensor device 3 has two optical connections 3A and 3B, such that light coupled in at one connection 3A or 3B passes through sensor device 3 and is coupled out again at the respective other connection 3B or 3A. The first connection 3A of sensor device 3 is optically coupled via first polarizer 5 to one end of first optical transmission path 4. The second connection 3B of sensor device 3 is optically coupled via second polarizer 6 to one end of second optical transmission path 7.

The optical rotation means 8 are optically connected between the two polarizers 5 and 6. Rotation means 8 reciprocally rotate the plane of polarization of linearly polarized light passing through them by a predetermined angle of rotation $\alpha$. In general, rotation means 8 contain at least one rotation element which exhibits a reciprocal circular birefringence.

In the specific embodiment shown, rotation means 8 comprise two rotation elements 8A and 8B. First rotation element 8A is optically connected between first polarizer 5 and first connection 3A of sensor device 3, and second rotation element 8B is optically connected between second connection 3B of sensor device 3 and second polarizer 6. In this embodiment, the angle of rotation $\alpha$ of rotation means 8 results as the sum of the individual angles of rotation of the two rotation elements 8A and 8B. For example, each rotation element 8A and 8B can effect a rotation of the planes of polarization of the two light signals L1' and L2' by $\alpha/2$.

However, rotation means 8 can also be arranged only between first polarizer 5 and first connection 3A of sensor device 3, or only between second polarizer 6 and second connection 3B of sensor device 3.

The rotation means 8 or their rotation elements 8A and 8B are preferably formed with optically active materials.

The optical activity effects a reciprocal rotation of the plane of polarization of linearly polarized light passing through, and is thus a special case of reciprocal circular birefringence.

In addition, rotation means 8 or rotation elements 8A and 8B can also be realized with the aid of optical elements which exhibit a geometrically induced reciprocal circular birefringence. In these cases, a reciprocal rotation of the plane of polarization is achieved by means of the geometrical structural design of rotation means 8 or rotation elements 8A and 8B. Examples of this are optical fibers twisted with the aid of a torque (twisted fiber) or else spirally wound optical fibers.

In one special specific embodiment, sensor device 3 itself exhibits a well-defined reciprocal circular birefringence and hence forms at least one part of rotation means 8.

The axes of polarization (polarization axis, transmission axis) of the two polarizers 5 and 6 are preferably set to be at least approximately parallel or at least approximately at right angles relative to each other. The working point of the arrangement for H=0 is then exclusively set via the angle of rotation α of rotation means 8.

The optical series circuit, comprising first optical transmission path 4, first polarizer 5, sensor device 3, second polarizer 6, and second optical transmission path 7, as well as rotation means 8, is optically connected between two connections 40A and 40B of transmitting and evaluation unit 40. Transmitting and evaluation unit 40 contains means for transmitting two light signals L1' and L2', running in opposite directions, through the optical series circuit and rotation means 8. Unit 40 also includes an evaluation means for evaluating the two light intensities of the light signals, designated by L1 and L2, after the light signals pass through the series circuit. Transmitting and evaluation unit 40 produces a measuring signal M for the magnetic field H; signal M is virtually independent of any intensity changes in the two transmission paths 4 and 7. Measuring signal M is able to be tapped off at an output of transmitting and evaluation unit 40.

First light signal L1' is coupled into first transmission path 4 at connection 40A of transmitting and evaluation unit 40 and, after passing through first transmission path 4, is linearly polarized by first polarizer 5. The now linearly polarized light signal L1' is next fed into sensor device 3 at connection 3A. While passing through sensor device 3, the plane of polarization of the linearly polarized first light signal L1' is rotated by a Faraday measuring angle ρ which is dependent on magnetic field H. The linearly polarized first light signal L1' is further rotated by rotation means 8 by the predetermined angle of rotation α which is independent of magnetic field H. Thus, the plane of polarization of first light signal L1' is rotated between the two polarizers 5 and 6 by a total angle of rotation ρ+α, which corresponds to the sum of measuring angle ρ and fixed angle of rotation α. In this case and in the following text, a positive angle value corresponds to the mathematically positive direction of rotation, that is to say, the counter-clockwise direction. A negative angle value, on the other hand, corresponds to the mathematically negative direction of rotation, that is to say, the clockwise direction, relative to the propagation direction of the light signal being considered.

The first light signal L1', rotated in its plane of polarization by the total angle of rotation ρ+α, is now fed to second polarizer 6. Second polarizer 6 passes through only the portion of incoming first light signal L1' that is projected onto its axis of polarization; thus, second polarizer 6 serves as a polarization analyzer for first light signal L1'. The portion of first light signal L1' transmitted by second polarizer 6 is designated by L1 and is transmitted via second transmission path 7 to second connection 40B of transmitting and evaluation unit 40.

Second light signal L2' is coupled into second transmission path 7 at connection 40B of transmitting and evaluation unit 40. After passing through second transmission path 7, second light signal L2' is linearly polarized by second polarizer 6. The linearly polarized second light signal L2' is rotated by rotation means 8 by the predetermined angle of rotation α which is independent of magnetic field H and, in the reference system of second light signal L2', has the same sign and the same magnitude as in the case of first light signal Li'. The linearly polarized second light signal L2', rotated in its plane of polarization by angle of rotation α, is now coupled into sensor device 3 at connection 3B. While passing through sensor device 3, the plane of polarization of linearly polarized second light signal L2' is rotated by a Faraday measuring angle −ρ which is dependent on magnetic field H. Because of the non-reciprocal property of the Faraday effect, Faraday measuring angle −ρ has the same magnitude but the opposite sign to that in the case of the first light signal L1'. The plane of polarization of second light signal L2' is thus rotated by a total angle of rotation of α−ρ, which corresponds to the sum of the fixed angle of rotation α and the measuring angle −ρ.

Second light signal L2', rotated in its plane of polarization by the total angle of rotation α−ρ, is now fed to first polarizer 5. First polarizer 5 allows through only the portion of incoming second light signal L2' projected onto its axis of polarization. Thus, first polarizer 5 acts as a polarization analyzer for second light signal L2'. The portion of second light signal L2' transmitted by first polarizer 5 is designated by L2 and is transmitted via first transmission path 4 to first connection 40A of transmitting and evaluation unit 40.

The evaluation means, not shown, in transmitting and evaluation unit 40 derives from light intensities I1 and I2 of the two light signals L1 and L2, after passing through the series circuit, a measuring signal M for magnetic field H. Measuring signal M is largely independent of intensity changes in the two transmission paths 4 and 7.

Since light intensity fluctuations in measuring signal M are essentially compensated, simple multimode fibers can also be used as transmission paths 4 and 7.

Transmitting and evaluation unit 40 can, for example, contain light-emitting diodes, not shown, which are alternately operated as transmitter and detector and are electrically connected to corresponding current sources and evaluation electronics. Further embodiments of the means for transmitting the two light signals L1' and L2' and the evaluation means for evaluating light intensities I1 and I2 of the two light signals L1 and L2, after passing through the series circuit, are further described in the following.

Figure 2:
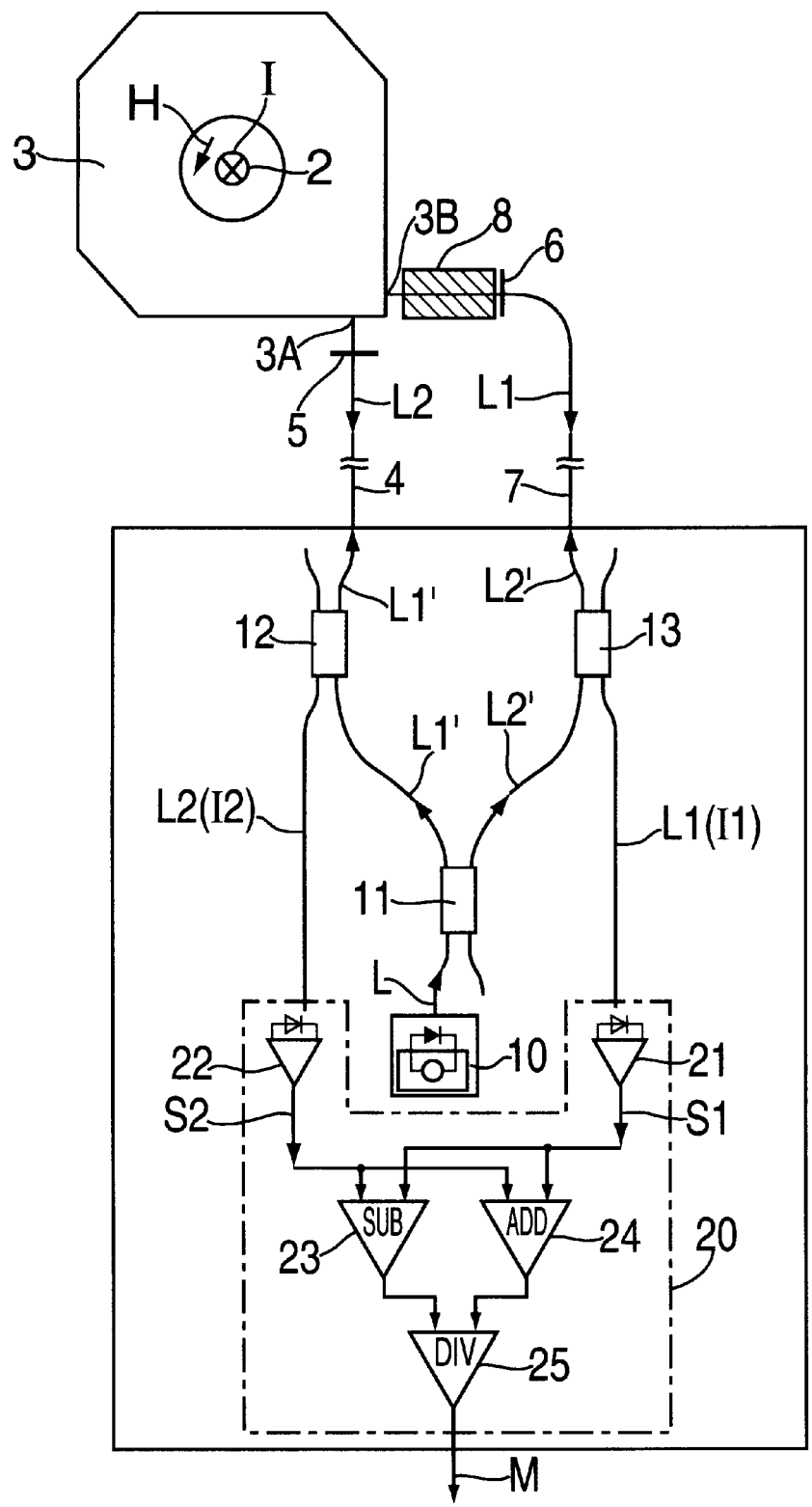
FIG. 2 shows in more detail a transmitting and evaluation unit of FIG. 1.

FIG. 2 shows an advantageous specific embodiment of the measuring arrangement. First transmission path 4 is optically connected via an optical coupler 12 both to a further optical coupler 11 and to evaluation means 20. Second transmission path 7 is likewise optically connected via a third optical coupler 13 both to optical coupler 11 and to evaluation means 20. Optical coupler 11 is optically connected to a light source 10 and splits light L from light source 10 into two light signals L1' and L2', which are fed to couplers 12 and 13, respectively. Coupler 12 feeds light signal L1' to first transmission path 4, and coupler 13 feeds light signal L2' to second transmission path 7. Both light signals L1' and L2' pass, in mutually opposite feed directions, through the optical series circuit comprising first transmission path 4, first polarizer 5, sensor device 3, second polarizer 6 and second transmission path 7, and are coupled out of the series circuit again as light signals now designated by L1 or L2, respectively.

Light source 10 and the three optical couplers 11, 12, and 13 thus form means for transmitting two light signals L1' and L2' through the series circuit in opposite directions. Couplers 11, 12, and 13 can also be at least partially replaced by optical beam splitters. In addition, instead of coupler 11 and the one light source 10, two light sources can also be provided which, in each case, transmit one light signal L1' and L2', respectively.

Light intensities I1' and I2' of the two light signals L1' and L2', before coupling into the series circuit, are generally set in a fixed predetermined ratio relative to each other. Preferably, both light intensities are equal, that is to say I1'=I2'. In the embodiments shown, coupler 11 then splits light L from light source 10 into two equal parts having a coupling ratio 50%:50%.

The measuring arrangement according to FIG. 2 is preferably provided for measuring an electric current I in at least one current conductor 2. The Faraday sensor device 3 detects magnetic field H inductively produced by this current I and rotates the planes of polarization of the two light signals L1' and L2' by a measuring angle ρ or −ρ, which are dependent on magnetic field H and hence on current I. In the particularly advantageous embodiment shown, sensor device 3 surrounds current conductor 2, so that both light signals L1' and L2' orbit around current I in a virtually closed light path. Measuring angle ρ in this case is directly proportional to electric current I. Sensor device 3 can be designed as a solid glass ring with internal reflection surfaces deflecting light signals L1' and L2'.

Figure 3:
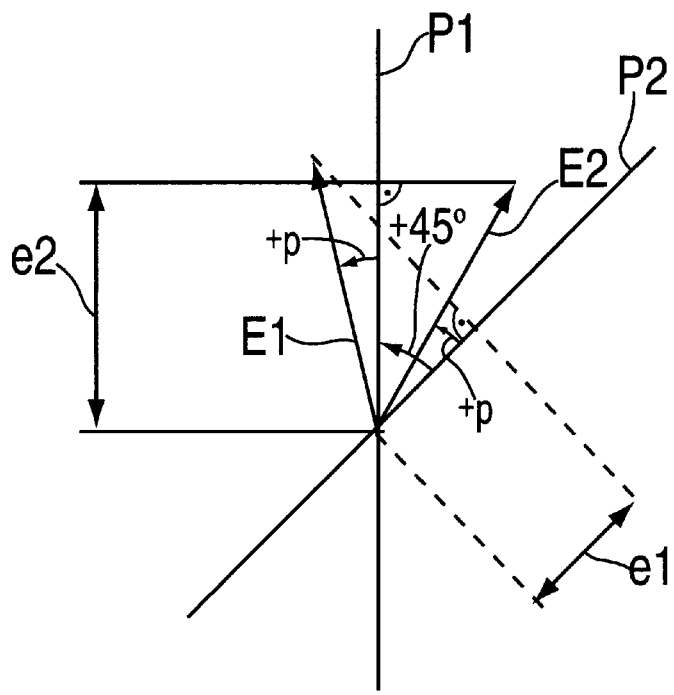
FIG. 3 shows a vector diagram of the rotation of polarization of the two oppositely directed light signals, given axes of polarization of the polarizers inclined at an angle of 45° relative to each other.
Figure 4:
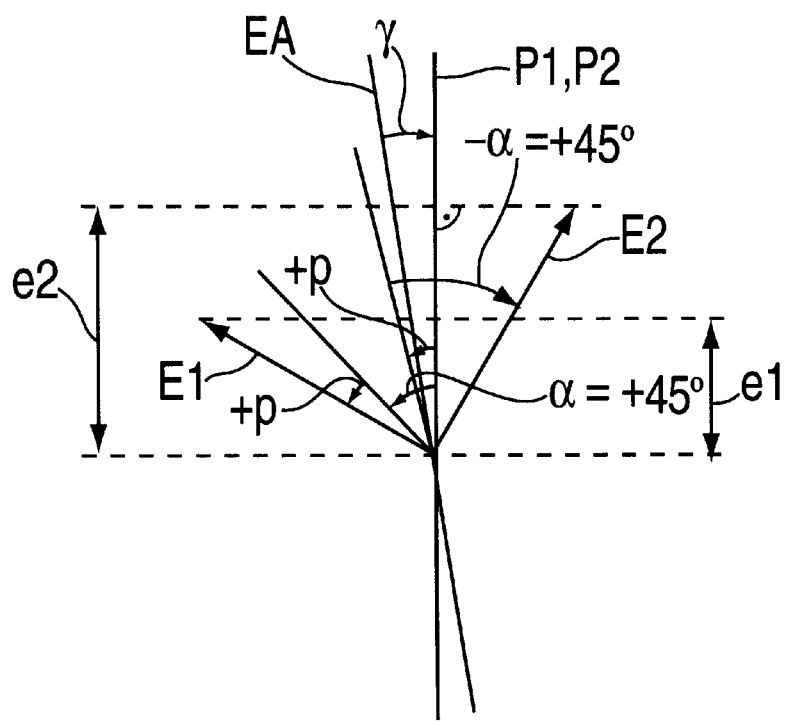
FIG. 4 shows a vector diagram of the rotation of polarization of the two oppositely directed light signals, given parallel axes of polarization of the two polarizers and a predetermined angle of rotation $\alpha=45°$.

The method of operation of the measuring method and of the measuring arrangement, in comparison with methods or arrangements known from the related art, is now explained in more detail using the vector diagrams of FIGS. 3 and 4.

Shown in FIG. 3 is a vector diagram for the electric field vectors E1 and E2 of the two light signals L1' or L1 and L2' or L2, running in opposite directions. This results from the operation of a measuring arrangement according to FIG. 1 without rotation means 8 and with axes of polarization of the two polarizers 5 and 6 rotated at a polarizer angle of 45° relative to each other. The axis of polarization of first polarizer 5 is designated by P1 and the axis of polarization of second polarizer 6 is designated by P2. The two axes of polarization P1 and P2 are inclined relative to each other at the polarizer angle of 45°. The electric field vector E1 of the first light signal L1', after passing through first polarizer 5, is directed parallel to its axis of polarization P1 and is then rotated in sensor device 3 by the measuring angle ρ which is assumed to be positive. First light signal L1', rotated in its plane of polarization by the measuring angle ρ, is then directly fed to second polarizer 6. The optical rotation means 8 are not present. Second polarizer 6 allows through only the portion of electric field vector E1 projected onto its axis of polarization P2, the field strength of the field vector being designated by e1. For the projected portion e1, it is true that $$e1 = |E1| \cos(45° + \rho) \qquad (1)$$

Light intensity I1 of light signal L1 transmitted by second polarizer 6 is given by $$I1 = (e1)^2 \sim \cos^2(45° + \rho) \qquad (2)$$

On the other hand, electric field vector E2 of second light signal L2' is coupled into sensor device 3 parallel to the axis of polarization P2 of second polarizer 6 and is rotated by the measuring angle +ρ under the influence of magnetic field H. Because of the non-reciprocal property of the Faraday effect, the measuring angle +ρ is likewise positive in the reference system shown, which is determined by the propagation direction of first light signal L1'. First polarizer 5, which is provided as an analyzer for second light signal L2', allows through only the portion e2, which is projected onto its axis of polarization P1, of the electric field vector E2, rotated by measuring angle +ρ, of second light signal L2'. For this projected portion e2, it is now true that $$e2 = |E2| \cos(45° - \rho) \qquad (3)$$

The light intensity I2 of second light signal L2 allowed through by first polarizer 5 is $$I2 = (e2)^2 \sim \cos^2(45° - \rho) \qquad (4)$$

From the equations (2) and (4), it can be seen that, with a polarizer angle of 45° between the two polarizers, the working point of the measurement lies at $\cos^2(45°)$ and thus at a maximum measuring sensitivity.

By way of comparison, FIG. 4 shows in a vector diagram the electric field vectors E1 and E2 of the two light signals L1 and L2 when passing through the series circuit in a design according to the present invention. Thus, the two electric field vectors E1 and E2 of the two light signals L1' and L2', after passing through first polarizer 5 or second polarizer 6, are directed parallel to each other. In the advantageous embodiment shown, the angle of rotation α of the rotation means is set to 45°. Electric field vector E1 of first light signal L1' is first rotated in sensor device 3 by the measuring angle +ρ, and then rotated by rotation means 8 by the angle of rotation α=+45°. As in FIG. 3, the signs of the angles being considered are relative to the reference system determined by the feed direction of first light signal L1'.

Only the portion projected onto axis of polarization P1 (=P2)

$$e1 = |E1| \cos(\rho + \alpha) = |E1| \cos(\rho + 45°) \qquad (5)$$

is allowed through by second polarizer 6, acting as an analyzer for first light signal L1'. Light intensity I1 of first light signal L1, after passing through second polarizer 6, is thus $$I1 = (e1)^2 \sim \cos^2(\rho + \alpha) = \cos^2(\rho + 45°) \qquad (6)$$

Electric field vector E2 of second light signal L2' is rotated by optical rotation means 8 out of its initial position, parallel to the axis of polarization P2 (=P1) of second polarizer 6, by the angle of rotation −α=−45°, sign of which is selected in the reference system fixed by the feed direction of first light signal L1', and which is determined by the reciprocal circular birefringence in rotation means 8. In sensor device 3, electric field vector E2 of second light signal L2' is rotated by magnetic field H by the measuring angle +ρ. First polarizer 5, as analyzer for second light signal L2', allows through the portion projected onto the axis of polarization P1

$$e2 = |E2| \cos(\rho - \alpha) = |E2| \cos(\rho - 45°) \qquad (7)$$

Light intensity I2 of second light signal L2, after passing through first polarizer 5, is thus $$I2=(e2)^2 \sim \cos^2(\rho-\alpha)=\cos^2(\rho-45°) \tag{8}$$

The two light intensities I1 and I2 of the two light signals L1 and L2, after passing through the series circuit, thus essentially coincide, according to the equations (2) and (6) or (4) and (8). Thus, even given axes of polarization P1 and P2 of the two polarizers 5 and 6 directed parallel to each other, the working point of the measuring method or of the measuring arrangement can be set, by using rotation means 8, to an unequivocal range of the characteristic curve for angles of rotation $\alpha \neq 0°$ and in particular to the point of maximum measuring sensitivity for angles of rotation $\alpha=\pm 45°$. This is analogously true even given axes of polarization P1 and P2 of polarizers 5 and 6 which are set at least approximately at right angles to each other. The adjustment expenditure when setting the working point can thus be reduced with the aid of rotation means 8.

While passing through the two transmission paths 4 and 7, in each case both light signals L1' or L1 and L2' or L2 experience the same intensity changes, which can be caused in particular by attenuation losses as a result of mechanical vibrations. These intensity changes appear in light intensities I1 and I2 essentially in the form of attenuation factors. The real, generally time-dependent attenuation factor of an optical transmission path is defined as the ratio of the light intensity of light arriving at one end of the transmission path to the input light intensity of the light when coupling into the other end of the transmission path. Let A be the real attenuation factor of first transmission path 4 and let B be the attenuation factor of second transmission path 7. Then, taking into account the equations (6) and (8), the following general equations are true for the light intensities I1 and I2 of the two light signals L1 and L2 after passing through the optical series circuit:

$$I1=I0\cdot A\cdot B\cdot \cos^2(\rho+\alpha) \tag{9}$$

$$I2=K\cdot I0\cdot B\cdot A\cdot \cos^2(\rho-\alpha) \tag{10}$$

I0 is a fixed predetermined initial intensity. K is a coupling factor which, in the exemplary embodiment shown, results from the coupling ratios of couplers 11, 12, and 13. If, in each case, the coupling ratios of all the couplers 11, 12, and 13 are 50%:50%, then K=1. The $\cos^2$ terms in equations (9) and (10) describe the dependence of light intensity I1 or I2 on the Faraday measuring angle $\rho$ for a predetermined angle of rotation $\alpha$. The factors in front of the $\cos^2$ terms in the expressions for the two light intensities I1 and I2 according to equations (9) and (10) differ only in terms of the coupling factor K.

Attenuation factors A and B of transmission paths 4 and 7 are now eliminated in a particularly advantageous specific embodiment, in that evaluation means 20 or transmitting and evaluation unit 40 derive, as measuring signal M for magnetic field H, a quotient signal of the form $$M=(a\cdot I1+b\cdot I2+c)/(d\cdot I1+e\cdot I2+f) \tag{11}$$

from two linear functions $a\cdot I1+b\cdot I2+c$ and $d\cdot I1+e\cdot I2+f$ of the two light intensities I1 and I2, using the real coefficients a, b, c, d, e, and f. In this case, at least either the coefficients a and e or the coefficients b and d are different from zero.

This measuring signal M according to equation (11) is virtually independent in particular of intensity changes caused by vibrations in transmissions paths 4 and 7. Hence, in all the embodiments, even simple, comparatively inexpensive telecommunications optical fibers (multimode fibers) can be used as transmission paths 4 and 7, since their relatively high attenuations and vibrational sensitivities are compensated in measuring signal M. However, other optical waveguides or free beam arrangements can also be used as transmission paths 4 and 7.

Coefficients a, b, c, d, e, and f of the linear functions in the numerator and denominator of equation (11) can, in particular, be adapted to different input intensities of the two light signals when coupling into the series circuit. Preferably, coefficients a, b, c, d, e, and f for light intensities I1 and I2, determined in accordance with equations (9) and (10), can be so adapted that, without taking into account linear birefringence effects in sensor device 3, a measuring signal $$M \sim \sin(2\rho) \tag{12}$$

results, which is essentially proportional to the sine of twice the Faraday measuring angle $\rho$. Coefficients d, e, and f of linear function $d\cdot I1+e\cdot I2+f$ in the denominator of the quotient according to equation (11) are preferably so set that linear function $d\cdot I1+e\cdot I2+f$ is virtually constant and thus independent of magnetic field H.

In one special embodiment, a quotient $$M=I1/I2=\cos^2(\rho+\alpha)/(K\cdot \cos^2(\rho-\alpha)) \tag{13}$$

or $$M=I2/I1=(K\cdot \cos^2(\rho\alpha))/\cos^2(\rho+\alpha) \tag{13'}$$

of the two light intensities I1 and I2 is used as measuring signal M. This quotient according to equation (13) or (13') results from the general quotient according to equation (11), if the coefficients a=e=1 and b=c=d=f=0, or a=c=e=f=0 and b=d=1 are selected. This measuring signal M depends on measuring angle $\rho$ and hence on magnetic field H.

In particular in the case of at least approximately equal input intensities I1' and I2' of the two light signals L1' and L2', in one advantageous embodiment, the quotient $$M=(I1-I2)/(I1+I2) \tag{14}$$

of a difference I1–I2 (or I2–I1) and the sum I1+I2 of the two light intensities I1 and I2, after passing through the series circuit, can also be used as measuring signal M. This measuring signal M is then once more proportional to sin(2$\rho$), if no linear birefringence effects occur in sensor device 3.

Measuring signal M, freed of attenuation factors A and B of transmission paths 4 and 7, can be derived in various ways by evaluation means 20 from the two light intensities I1 and I2 of the two light signals L1 and L2, running in opposite directions. In general, both light signals L1 and L2 are first converted photoelectrically by evaluation means 20 in each case into an electric intensity signal which is a direct measure of light intensity I1 or I2 of the respective light signal L1 or L2. From these two electric intensity signals, measuring signal M is determined with the aid of a value table or by computation. For this purpose, evaluation means 20 contain appropriate analog or digital modules.

In an embodiment which is not shown, the two electric intensity signals are first digitized with the aid of an analog/digital converter, and the digitized signals are further processed by a microprocessor or a digital signal processor according to one of the equations (11), (13), (13'), or (14).

In order to determine measuring signal M as a predetermined function M(I1,I2) of the two light intensities I1 and I2 according to equation (11), (13), (13'), or (14), analog components can also be used which, as a rule, operate faster than digital components.

In the specific embodiment according to FIG. 2, the evaluation means 20 includes analog modules. Evaluation means 20 in this embodiment comprise two photoelectric transducers 21 and 22, a subtracter 23, an adder 24, and a divider 25. First transducer 21 is optically connected to coupler 13 and converts first light signal L1, after its passage through the series circuit, into a first electric intensity signal S1 whose signal strength corresponds to light intensity I1 of first light signal L1. Second transducer 22 is optically connected to coupler 12 and converts second light signal L2, after its passage through the series circuit, into a second electric intensity signal S2 as a measure of light intensity I2 of second light signal L2. Both electric intensity signals S1 and S2 are, in each case, fed to an input of subtracter 23 and adder 24. The difference signal S1–S2 (or S2–S1) at the output of subtracter 23 and the sum signal S1+S2 at the output of adder 24 are, in each case, fed to an input of divider 25. The output signal from the divider (S1–S2)/(S1+S2) is used as measuring signal M and is fed to an output of evaluation means 20. Thus, this measuring signal M corresponds to equation (14).

A measuring signal M satisfying the general equation (11) can be simply obtained with the aid of analog components, in an embodiment which is not shown, by additionally connecting an amplifier in each case upstream of the inputs of subtracter 23 and adder 24. In this case, the gain factors of these amplifiers are adapted to the corresponding coefficients a,–b for negative b, d and e of the two linear functions in equation (4), and further adders are provided for additionally adding the coefficient c to the output signal from subtracter 23 according to the numerator in equation (11). The additional adders are also provided for additionally adding the coefficient f to the output signal at the output of adder 24 according to the denominator in equation (11). The output signals from the two further adders are then fed to the inputs of divider 25. If b is positive, then preferably a further adder is used instead of subtracter 23.

By adapting the coefficients a, b, c, d, e, and f in the case of the measuring signal M formed according to equation (11), it is also possible, in a special embodiment, to balance out different sensitivities of the two photoelectric transducers 21 and 22.

In all the specific embodiments, the predetermined angle of rotation $\alpha$ of rotation means 8 is preferably set to an odd-numbered multiple of about ±45° or about ±π/4. However, other angles of rotation $\alpha$ can also be used.

An additional problem in the measurement of a magnetic field H or an electric current I according to one of the measuring methods or measuring arrangements described can be presented by temperature influences in sensor device 3. These temperature influences induce a linear birefringence $\delta$ as a function $\delta(T)$ of temperature T in sensor device 3, which can falsify the measurement of magnetic field H or of electric current I. In addition, temperature changes can also change the Verdet constant, and hence the measuring sensitivity.

This temperature dependence of measuring signal M is now essentially eliminated by means of the measures for temperature compensation described in the following. The axes of polarization P1 and P2 of the two polarizers 5 and 6 are set at a polarizer angle $\gamma$, shown in FIG. 4, in relation to an intrinsic axis (principal axis, optical axis) EA of the linear birefringence $\delta$ in sensor device 3. Polarizer angle $\gamma$ is determined at least approximately according to the equation $$\cos(4\gamma - 2\alpha) = -2/3 \tag{15}$$

An intrinsic axis EA of linear birefringence $\delta$ is, in this case, defined by that direction of polarization at which linearly polarized light coupled into sensor device 3 leaves said sensor device 3 again unchanged. If, on the other hand, linearly polarized light is coupled into sensor device 3 with a plane of polarization which is not directed parallel to one of the intrinsic axes of sensor device 3, the light is elliptically polarized when passing through sensor device 3 because of the linear birefringence $\delta$. The two intrinsic axes, generally orthogonal relative to each other, of the linear birefringence $\delta$ can be determined in a manner known per se. For example, sensor device 3 can be arranged between a polarizer, for example polarizer 5, and an analyzer, for example polarizer 6. The axes of polarization of the two polarizers are set transversely relative to each other. Now, in one specific embodiment, the two axes of polarization of polarizer and analyzer are rotated in the same direction in relation to a reference axis of sensor device 3 until the intensity of the light transmitted by the analyzer is equal to zero (maximum light extinguishing). The intrinsic axes are then parallel to the two axes of polarization of polarizer and analyzer. As an alternative to this, in another embodiment, the two axes of polarization are also rotated in the same direction in relation to the reference axis of sensor device 3 until the intensity of the light transmitted by the analyzer is maximum (minimum light extinguishing). In this case, the light is circularly polarized upon emerging from sensor device 3. The intrinsic axes of the linear birefringence $\delta$ are then offset by 45° or –45° in relation to the axis of polarization of the analyzer.

If the preferred angle of rotation $\alpha = -45°$ or $\alpha = -45° - n \cdot 180° = -(1+4n) \cdot 45°$ is selected, using any whole number n, the equation (15) then reduces to $$\sin(4\gamma) = +2/3 \tag{15'}$$

On the other hand, given the angle of rotation $\alpha = +45°$ or $\alpha = +(1+4n) \cdot 45°$, using any whole number n, the equation (15) reduces to $$\sin(4\gamma) = -2/3 \tag{15''}$$

A possible value, fulfilling equation (15'), for polarizer angle $\gamma$ is, for example, $\gamma = +10.45°$. A polarizer angle $\gamma$ which fulfils equation (15'') is, for example, $\gamma = -10.45°$.

Deviations from the angle values exactly fulfilling equation (15), (15') or (15'') for polarizer angle $\gamma$ are possible, in particular in the case of inhomogeneous linear and/or circular birefringence and/or a strongly temperature-dependent Verdet constant in sensor device 3, and can generally amount to up to 5°. The angle of rotation $\alpha$ can also deviate up to about ±10° from its ideal value $\alpha = +(1+4n) \cdot 45°$ or $\alpha = -(1+4n) \cdot 45°$ for the temperature compensation.

Measuring signal M, which is determined with a polarizer angle $\gamma$ set at least approximately according to equation (15), (15') or (15''), even in the event of changing temperatures in sensor device 3, now essentially corresponds to the measuring signal without linear birefringence $\delta$, that is to say, in the case of a measuring signal M derived according to equation (11) or (14), to a variable proportional to $\sin(2\rho)$ according to the equation (12).

In one special specific embodiment, the polarizer angle $\gamma$, which is optimum according to equation (15), (15') or (15''), of the two polarizers 5 or 6 in relation to the intrinsic axis of the linear birefringence $\delta$ can be set simply, such that, in a calibration measurement, the measuring signal M is compared, in terms of its dependence on the temperature, with its desired value to be expected without linear birefringence δ, in particular according to the equation (12), for a predetermined polarizer angle γ as parameter, and the polarizer angle γ is changed until the current measuring signal M agrees with the virtually temperature-independent desired value.

One advantage of the temperature compensation by setting the polarizer angle γ is the high bandwidth when measuring magnetic fields H or electric currents I. Namely, in principle, the frequency spectrum of the magnetic fields H or electric currents I to be measured is not restricted by the measures for temperature compensation.

What is claimed is:

1. A method for measuring a magnetic field with a sensor device exhibiting the Faraday effect, the method comprising the steps of:
   a) supplying a first light signal and a second light signal, in mutually opposite directions, through an optical series circuit comprising a first optical transmission path, a first polarizer, the sensor device, a second polarizer, and a second optical transmission path;
   b) rotating, between the first polarizer and the second polarizer, each one of a first plane of polarization of the first light signal and a second plane of polarization of the second light signal by a predetermined angle of rotation α which is independent of the magnetic field; and
   c) determining, after each one of the first light signal and the second light signal passes through the optical series circuit, a measuring signal for the magnetic field from a first light intensity of the first light signal and a second light intensity of the second light signal, the measuring signal being essentially independent of intensity changes in the first optical transmission path and the second optical transmission path;
   wherein a first axis of polarization of the first polarizer and a second axis of polarization of the second polarizer are each rotated by a polarizer angle γ in relation to an intrinsic axis of a linear birefringence in the sensor device, the polarizer angle α fulfilling, within ±5°, the equation $\sin(4\gamma) = +2/3$ when the angle of rotation α corresponds, within ±10°, to an angle $-(1+4n)\cdot 45°$, and $\sin(4\gamma) = -2/3$ when the angle of rotation α corresponds, within ±10°, to an angle $+(1+4n)\cdot 45°$, wherein n is a whole number.

2. The method according to claim 1 wherein a first axis of polarization of the first polarizer and a second axis of polarization of the second polarizer are set in one of a parallel configuration and a orthogonal configuration relative to each other.

3. The method according to claim 1 wherein the measuring signal corresponds to a quotient $((a\cdot I1+b\cdot I2+c)/(d\cdot I1+e\cdot I2+f))$, wherein I1 is the first light intensity of the first light signal, wherein I2 is the second light intensity of the second light signal, and wherein a, b, c, d, e, and f comprise real coefficients.

4. The method according to claim 1 wherein the measuring signal is proportional to a quotient $((I1-I2)/(I1+I2))$, wherein I1 is the first light intensity of the first light signal, and wherein I2 is the second light intensity of the second light signal.

5. The method according to claim 1, wherein the measuring signal is proportional to one of a quotient I1/I2 and a quotient I2/I1, wherein I1 is the first light intensity of the first light signal, and wherein I2 is the second light intensity of the second light signal.

6. The method according to claim 1, wherein the angle of rotation α corresponds within ±10°, to an odd-numbered multiple of one of +45° and −45°.

7. The method according to claim 1, wherein the magnetic field is produced by an electric current, and wherein the measuring signal measures the electric current.

8. A system for measuring a magnetic field, comprising:
   an optical series circuit comprising:
      a first optical transmission path,
      a first polarizer coupled to the first transmission path,
      a second optical transmission path,
      a second polarizer coupled to the second transmission path,
      a sensor device exhibiting the Faraday effect and coupled between the first polarizer and the second polarizer, and
      optical rotation means, optically connected between the first polarizer and the second polarizer, for rotating each one of a first plane of polarization a of a first light signal and a second plane of polarization of a second light signal by a predetermined angle of rotation α which is independent of the magnetic field;
   means, coupled to the optical series circuit, for transmitting the first light signal and the second light signal through the optical series circuit, the first light signal and the second light signal passing through the series circuit in opposite directions; and
   evaluation means, coupled to the optical series circuit, for deriving a measuring signal for the magnetic field from a light intensity of the first light signal and a light intensity of the second light signal, wherein the measuring signal is derived after each one of the first light signal and the second light signal passes through the optical series circuit, and wherein the measuring signal is essentially independent of intensity changes in the first optical transmission path and the second optical transmission paths
   wherein a first axis of polarization of the first polarizer and a second axis of polarization of the second polarizer are each rotated by a polarizer angle γ in relation to an intrinsic axis of a linear birefringence in the sensor device, the polarizer angle γ fulfilling, within ±5°, the equation $\sin(4\gamma) = +2/3$ when the angle of rotation α corresponds, within ±10°, to an angle $-(1+4n)\cdot 45°$, and $\sin(4\gamma) = -2/3$ when the angle of rotation α corresponds, within ±10°, to an angle $+(1+4n)\cdot 45°$, wherein n is a whole number.

9. The system according to claim 8, wherein a first axis of polarization of the first polarizer and a second axis of polarization of the second polarizer are set in one of a parallel configuration and an orthogonal configuration relative to each other.

10. The system according to claim 8, wherein the rotation means comprises at least one rotation element exhibiting a reciprocal circular birefringence.

11. The system according to claim 10, wherein the at least one rotation element exhibits optical activity.

12. The system according to claim 10, wherein the reciprocal circular birefringence of the at least one rotation element is geometrically induced.

13. The system according to claim 8, wherein the measuring signal corresponds to a quotient $((a \cdot I1+b \cdot I2+c)/(d \cdot I1+e \cdot I2+f))$, wherein I1 is the first light intensity of the first light signal, wherein I2 is the second light intensity of the second light signal, and wherein a, b, c, d, e, and f comprise real coefficients.

14. The system according to claim 8, wherein the measuring signal is proportional to a quotient $((I1-I2)/(I1+I2))$, wherein I1 is the first light intensity of the first light signal, and wherein I2 is the second light intensity of the second light signal.

15. The system according to claim 8, wherein the measuring signal is proportional to one of a quotient I1/I2 and a quotient I2/I1, wherein I1 is the first light intensity of the first light signal, and wherein I2 is the second light intensity of the second light signal.

16. The system according to claim 8, wherein the first optical transmission path and the second optical transmission path are each formed by multimode optical fibers.

17. The system according to claim 4, wherein the angle of rotation α corresponds within ±10° to an odd-numbered multiple of 45°.

18. The system according to claim 8, wherein the magnetic field is produced by an electric current, and wherein the measuring signal measures the electric current.

19. The system according to claim 10, wherein the sensor device itself forms at least one part of the rotation means.

20. A method for measuring a magnetic field with a sensor device exhibiting the Faraday effect, the method comprising the steps of:
   a) supplying a first light signal and a second light signal, in mutually opposite directions, through an optical series circuit comprising a first optical transmission path, a first polarizer, the sensor device, a second polarizer, and a second optical transmission path;
   b) rotating, between the first polarizer and the second polarizer, each one of a first plane of polarization of the first light signal and a second plane of polarization of the second light signal by a predetermined angle of rotation α which is independent of the magnetic field; and
   c) determining, after each one of the first light signal and the second light signal passes through the optical series circuit, a measuring signal for the magnetic field from a first light intensity of the first light signal and a second light intensity of the second light signal, the measuring signal being essentially independent of intensity changes in the first optical transmission path and the second optical transmission path;
   wherein the measuring signal corresponds to a quotient $((a \cdot I1+b \cdot I2+c)/(d \cdot I1+e \cdot I2+f))$, wherein I1 is the first light intensity of the first light signal, wherein I2 is the second light intensity of the second light signal, and wherein a, b, c, d, e, and f comprise real coefficients.

21. The method according to claim 20, wherein a first axis of polarization of the first polarizer and a second axis of polarization of the second polarizer are set in one of a parallel configuration and an orthogonal configuration relative to each other.

22. The method according to claim 20, wherein an axis of polarization of the first polarizer and an axis of polarization of the second polarizer are each rotated by a polarizer angle γ in relation to an intrinsic axis of a linear birefringence in the sensor device, the polarizer angle γ fulfilling, within ±5°, the equation $$\sin(4\gamma)=+2/3$$

when the angle of rotation α corresponds, within ±10°, to an angle $-(1+4n) \cdot 45°$, and $$\sin(4\gamma)=-2/3$$

when the angle of rotation α corresponds, within ±10°, to an angle $+(1+4n) \cdot 45°$, wherein n is a whole number.

23. The method according to claim 20, wherein the magnetic field is produced by an electric current, and wherein the measuring signal measures the electric current.

24. A system for measuring a magnetic field, comprising:
   an optical series circuit comprising:
      a first optical transmission path,
      a first polarizer coupled to the first transmission path,
      a second optical transmission path,
      a second polarizer coupled to the second transmission path,
      a sensor device exhibiting the Faraday effect and coupled between the first polarizer and the second polarizer, and
      optical rotation means, optically connected between the first polarizer and the second polarizer, for rotating each one of a first plane of polarization a of a first light signal and a second plane of polarization of a second light signal by a predetermined angle of rotation α which is independent of the magnetic field;
   means, coupled to the optical series circuit, for transmitting the first light signal and the second light signal through the optical series circuit, the first light signal and the second light signal passing through the series circuit in opposite directions; and
   evaluation means, coupled to the optical series circuit, for deriving a measuring signal for the magnetic field from a light intensity of the first light signal and a light intensity of the second light signal, wherein the measuring signal is derived after each one of the first light signal and the second light signal passes through the optical series circuit, and wherein the measuring signal is essentially independent of intensity changes in the first optical transmission path and the second optical transmission path;
   wherein the measuring signal corresponds to a quotient $((a \cdot I1+b \cdot I2+c)/(d \cdot I1+e \cdot I2+f))$, wherein I1 is the first light intensity of the first light signal, wherein I2 is the second light intensity of the second light signal, and wherein a, b, c, d, e, and f comprise real coefficients.

25. The system according to claim 24, wherein a first axis of polarization of the first polarizer and a second axis of polarization of the second polarizer are set in one of a parallel configuration and an orthogonal configuration relative to each other.

26. The system according to claim 24, wherein the rotation means comprises at least one rotation element exhibiting a reciprocal circular birefringence.

27. The system according to claim 24, wherein the at least one rotation element exhibits optical activity.

28. The system according to claim 24, wherein the reciprocal circular birefringence of the at least one rotation element is geometrically induced.

29. The system according to claim 24, wherein the first optical transmission path and the second optical transmission path are each formed by multimode optical fibers.

30. The system according to claim 24, wherein an axis of polarization of the first polarizer and an axis of polarization of the second polarizer are each rotated by a polarizer angle γ in relation to an intrinsic axis of a linear birefringence in the sensor device, the polarizer angle γ fulfilling, within ±5°, the equation $$\sin(4\gamma) = +2/3$$

when the angle of rotation α corresponds, within ±10°, to an angle −(1+4n)·45°, and $$\sin(4\gamma) = -2/3$$

when the angle of rotation α corresponds, within ±10°, to an angle +(1+4n)·45°, wherein n is a whole number.

31. The system according to claim 24, wherein the magnetic field is produced by an electric current, and wherein the measuring signal measures the electric current.

32. The system according to claim 24, wherein the sensor device itself forms at least one part of the rotation means.

33. A method for measuring a magnetic field with a sensor device exhibiting the Faraday effect, the method comprising the steps of:
   a) supplying a first light signal and a second light signal, in mutually opposite directions, through an optical series circuit comprising a first optical transmission path, a first polarizer, the sensor device, a second polarizer, and a second optical transmission path;
   b) rotating, between the first polarizer and the second polarizer, each one of a first plane of polarization of the first light signal and a second plane of polarization of the second light signal by a predetermined angle of rotation α which is independent of the magnetic field; and
   c) determining, after each one of the first light signal and the second light signal passes through the optical series circuit, a measuring signal for the magnetic field from a first light intensity of the first light signal and a second light intensity of the second light signal, the measuring signal being essentially independent of intensity changes in the first optical transmission path and the second optical transmission path;
   wherein the measuring signal is proportional to one of a quotient I1/I2 and a quotient I2/I1, wherein I1 is the first light intensity of the first light signal, and wherein I2 is the second light intensity of the second light signal.

34. The method according to claim 33, wherein a first axis of polarization of the first polarizer and a second axis of polarization of the second polarizer are set in one of a parallel configuration and an orthogonal configuration relative to each other.

35. The method according to claim 33, wherein the angle of rotation α corresponds, within ±10°, to an odd-numbered multiple of one of +45° and −45°.

36. The method according to claim 33, be wherein an axis of polarization of the first polarizer and an axis of polarization of the second polarizer are each rotated by a polarizer angle γ in relation to an intrinsic axis of a linear birefringence in the sensor device, the polarizer angle γ fulfilling, within ±5°, the equation $$\sin(4\gamma) = +2/3$$

when the angle of rotation α corresponds, within ±10°, to an angle −(1+4n)·45°, and $$\sin(4\gamma) = -2/3$$

when the angle of rotation α corresponds, within ±10°, to an angle +(1+4n)·45°, wherein n is a whole number.

37. The method according to claim 33, wherein the magnetic field is produced by an electric current, and wherein the measuring signal measures the electric current.

38. A system for measuring a magnetic field, comprising:
   an optical series circuit comprising:
      a first optical transmission path,
      a first polarizer coupled to the first transmission path,
      a second optical transmission path,
      a second polarizer coupled to the second transmission path,
      a sensor device exhibiting the Faraday effect and coupled between the first polarizer and the second polarizer, and
      optical rotation means, optically connected between the first polarizer and the second polarizer, for rotating each one of a first plane of polarization a of a first light signal and a second plane of polarization of a second light signal by a predetermined angle of rotation α which is independent of the magnetic field;
   means, coupled to the optical series circuit, for transmitting the first light signal and the second light signal through the optical series circuit, the first light signal and the second light signal passing through the series circuit in opposite directions; and
   evaluation means, coupled to the optical series circuit, for deriving a measuring signal for the magnetic field from a light intensity of the first light signal and a light intensity of the second light signal, wherein the measuring signal is derived after each one of the first light signal and the second light signal passes through the optical series circuit, and wherein the measuring signal is essentially independent of intensity changes in the first optical transmission path and the second optical transmission path;
   wherein the measuring signal is proportional to one of a quotient I1/I2 and a quotient I2/I1, wherein I1 is the first light intensity of the first light signal, and wherein I2 is the second light intensity of the second light signal.

39. The system according to claim 38 wherein a first axis of polarization of the first polarizer and a second axis of polarization of the second polarizer are set in one of a parallel configuration and an orthogonal configuration relative to each other.

40. The system according to claim 38, wherein the rotation means comprises at least one rotation element exhibiting a reciprocal circular birefringence.

41. The system according to claim 38, wherein the at least one rotation element exhibits optical activity.

42. The system according to claim 38, wherein the reciprocal circular birefringence of the at least one rotation element is geometrically induced.

43. The system according to claim 38, wherein the first optical transmission path and the second optical transmission path are each formed by multimode optical fibers.

44. The system according to claim 38, wherein the angle of rotation α corresponds, within ±10°, to an odd-numbered multiple of 45°.

45. The system according to claim 38, wherein an axis of polarization of the first polarizer and an axis of polarization of the second polarizer are each rotated by a polarizer angle γ in relation to an intrinsic axis of a linear birefringence in the sensor device, the polarizer angle γ fulfilling, within ±5°, the equation $$\sin(4\gamma) = +2/3$$

when the angle of rotation α corresponds, within ±10°, to an angle−(1+4n)·45°, and $$\sin(4\gamma) = -2/3$$

when the angle of rotation α corresponds, within ±10°, to an angle+(1+4n)·45°, wherein n is a whole number.

46. The system according to claim 38, wherein the magnetic field is produced by an electric current, and wherein the measuring signal measures the electric current.

47. The system according to claim 38, wherein the sensor device itself forms at least one part of the rotation means.

* * * * *